US012578360B2

(12) United States Patent (10) Patent No.: US 12,578,360 B2
Ting et al. (45) Date of Patent: Mar. 17, 2026

(54) JIG AND METHOD FOR GRINDING PROBE PINS OF PROBE CARD

(71) Applicant: United Microelectronics Corp., Hsinchu (TW)

(72) Inventors: Yi-Fang Ting, Kaohsiung City (TW); Chiu Hua Wang, Tainan City (TW); Cheng Hui Tu, Chiayi County (TW)

(73) Assignee: United Microelectronics Corp., Hsinchu (TW)

( * ) Notice: Subject to any disclaimer, the term of this patent is extended or adjusted under 35 U.S.C. 154(b) by 224 days.

(21) Appl. No.: 18/432,043

(22) Filed: Feb. 4, 2024

(65) Prior Publication Data

US 2025/0237675 A1 Jul. 24, 2025

(30) Foreign Application Priority Data

Jan. 18, 2024 (TW) ................................. 113101951

(51) Int. Cl.
*G01R 3/00* (2006.01)
*G01R 1/073* (2006.01)

(52) U.S. Cl.
CPC ............ *G01R 3/00* (2013.01); *G01R 1/07314* (2013.01)

(58) Field of Classification Search
CPC ........................ G01R 1/07307; G01R 1/07342
See application file for complete search history.

(56) References Cited

U.S. PATENT DOCUMENTS

| | | | |
|---|---|---|---|
| 6,817,052 B2 * | 11/2004 | Grube ................... | B08B 7/0028 324/755.05 |
| 7,345,466 B2 * | 3/2008 | Vogtmann ................. | B08B 1/10 324/758.04 |
| 9,383,389 B2 | 7/2016 | Yano et al. | |

* cited by examiner

*Primary Examiner* — Tung X Nguyen
(74) *Attorney, Agent, or Firm* — JCIPRNET

(57) ABSTRACT

A jig and a method for grinding probe pins of a probe card. The jig includes a carrier and a connecting part. The carrier carries a support body with a grinding sheet, and the carrier includes an opening. The support body with the grinding sheet straddles above the opening. The opening may expose a plurality of probe pins of the probe card.

18 Claims, 14 Drawing Sheets

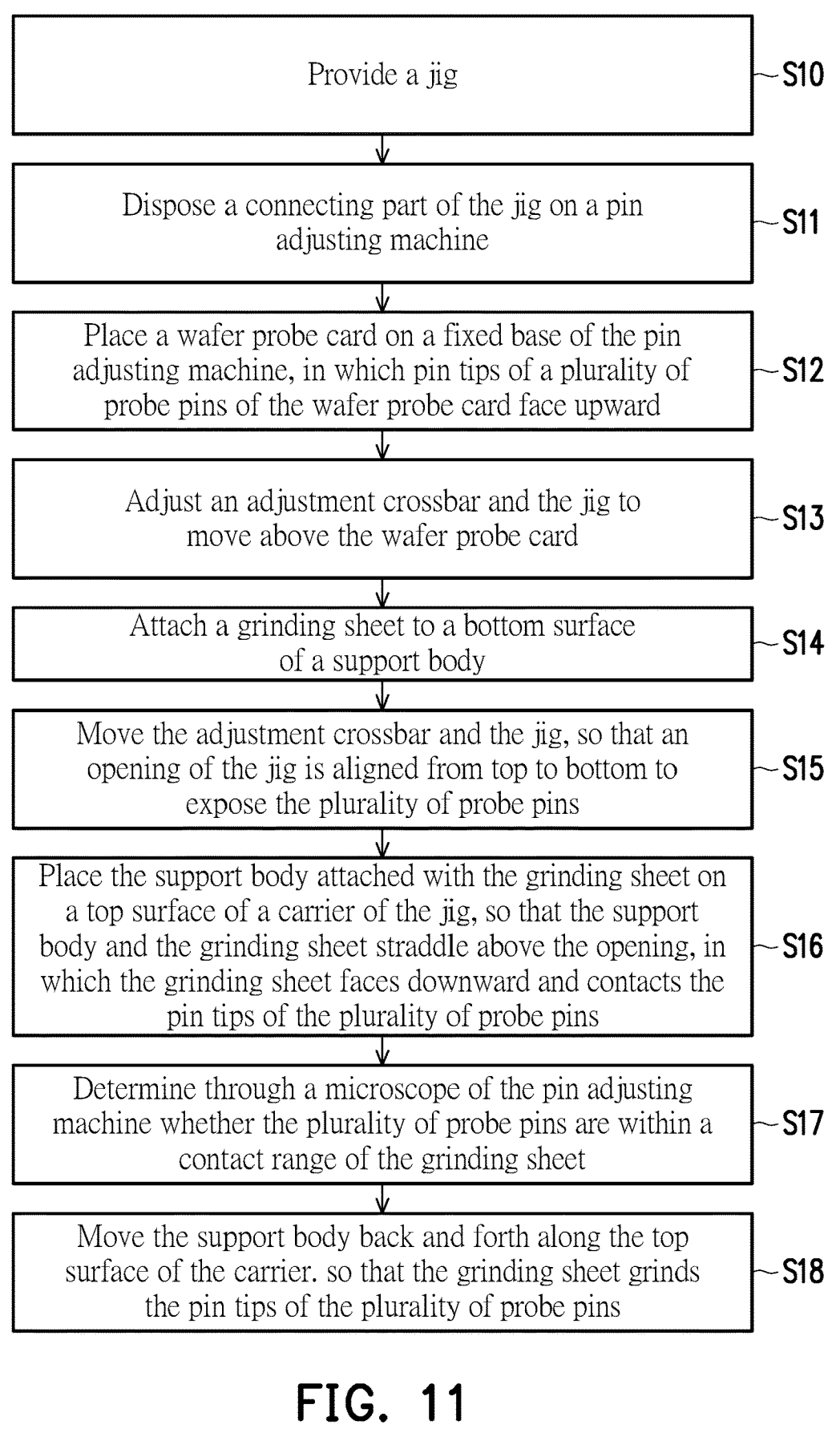

| Provide a jig | S10 |

↓

| Dispose a connecting part of the jig on a pin adjusting machine | S11 |

↓

| Place a wafer probe card on a fixed base of the pin adjusting machine, in which pin tips of a plurality of probe pins of the wafer probe card face upward | S12 |

↓

| Adjust an adjustment crossbar and the jig to move above the wafer probe card | S13 |

↓

| Attach a grinding sheet to a bottom surface of a support body | S14 |

↓

| Move the adjustment crossbar and the jig, so that an opening of the jig is aligned from top to bottom to expose the plurality of probe pins | S15 |

↓

| Place the support body attached with the grinding sheet on a top surface of a carrier of the jig, so that the support body and the grinding sheet straddle above the opening, in which the grinding sheet faces downward and contacts the pin tips of the plurality of probe pins | S16 |

↓

| Determine through a microscope of the pin adjusting machine whether the plurality of probe pins are within a contact range of the grinding sheet | S17 |

↓

| Move the support body back and forth along the top surface of the carrier. so that the grinding sheet grinds the pin tips of the plurality of probe pins | S18 |

FIG. 11

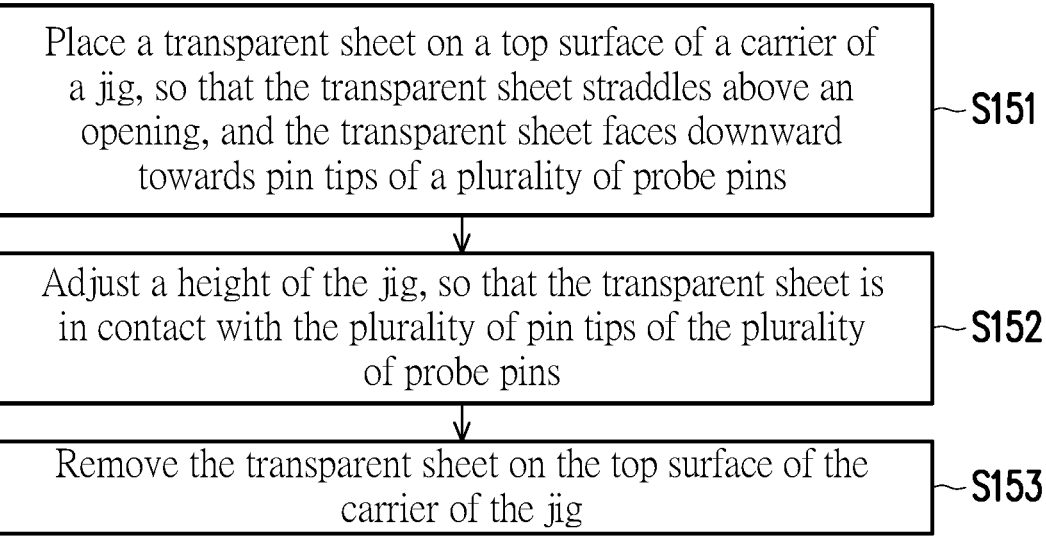

Place a transparent sheet on a top surface of a carrier of a jig, so that the transparent sheet straddles above an opening, and the transparent sheet faces downward towards pin tips of a plurality of probe pins ~S151

Adjust a height of the jig, so that the transparent sheet is in contact with the plurality of pin tips of the plurality of probe pins ~S152

Remove the transparent sheet on the top surface of the carrier of the jig ~S153

FIG. 12

JIG AND METHOD FOR GRINDING PROBE PINS OF PROBE CARD

CROSS-REFERENCE TO RELATED APPLICATION

This application claims the priority benefit of Taiwan application serial no. 113101951, filed on Jan. 18, 2024. The entirety of the above-mentioned patent application is hereby incorporated by reference herein and made a part of this specification.

BACKGROUND

Technical Field

The disclosure relates to a jig and a method, and particularly to a jig and a method for grinding probe pins of a probe card.

Description of Related Art

When a probe card is used for a long time, it is easy to cause the pin tips of the probe pins of the probe card to bend, deflect, or deform, resulting in a difference in the height of the pin tips of the plurality of probe pins and affecting the accuracy of detecting wafers. When the difference in the pin tip level of the entire probe pin of the probe card exceeds 20 um, a pin grinding machine dedicated to the probe card is usually used for repair. However, the existing pin grinding machines for probe cards have a precise structure and are expensive to manufacture.

SUMMARY

Embodiments of the disclosure provide a jig and a method for grinding probe pins of a probe card, which can easily, accurately, and quickly align and precisely grind the pin tips of the probe pins of the probe card, thereby improving the convenience and grinding efficiency of repairing the probe card and saving time and equipment acquisition costs.

A jig for grinding probe pins of a probe card according to an embodiment of the disclosure includes a carrier and a connecting part. The carrier can be configured to carry a support body with a grinding sheet. The carrier has an opening, and the support body and the grinding sheet straddle above the opening. A size of the opening can at least expose a plurality of probe pins of the probe card, and a diameter of the opening is less than a length of the support body. The connecting part is connected to the carrier, and the carrier is detachably disposed on an adjustment crossbar of a pin adjusting machine through the connecting part.

A method for grinding probe pins of a probe card according to an embodiment of the disclosure includes the following steps. A jig is provided. The jig includes a carrier having an opening and a connecting part. The connecting part of the jig is disposed on an adjustment crossbar of a pin adjusting machine. The probe card is placed on a fixed base of the pin adjusting machine, in which pin tips of a plurality of probe pins of the probe card face upward. A grinding sheet is attached to a bottom surface of a support body. The adjustment crossbar and the jig are moved, so that the opening of the jig is aligned from top to bottom to expose the plurality of probe pins. The support body attached with the grinding sheet is placed on a top surface of the carrier of the jig such that the support body and the grinding sheet are straddle above the opening, in which the grinding sheet faces downward and contacts the pin tips of the plurality of probe pins. The support body is moved back and forth along the top surface of the carrier, so that the grinding sheet can grind the pin tips of the plurality of probe pins.

Based on the above, in the jig and the method of the embodiment of the disclosure, the plurality of probe pins of the probe card face upward, the grinding sheet is moved from top to bottom in a horizontal state and carried downward to contact the pin tips of the plurality of probe pins through the jig, and then the flat bottom surface of the support body itself is used to support the horizontal movement of the grinding sheet on the jig, so that the grinding sheet can grind the pin tips of the plurality of probe pins while maintaining a horizontal state, which avoids the occurrence of abnormalities such as uneven force application and wearing of the pin length in the conventional technology and is conducive to the pin adjusting machine of the currently commonly used probe card for installing the jig for grinding operations.

BRIEF DESCRIPTION OF THE DRAWINGS

FIG. 11 is a flowchart of a method according to an embodiment of the disclosure.

FIG. 12 is another flowchart of a method according to an embodiment of the disclosure.

DESCRIPTION OF THE EMBODIMENTS

Figure 1:
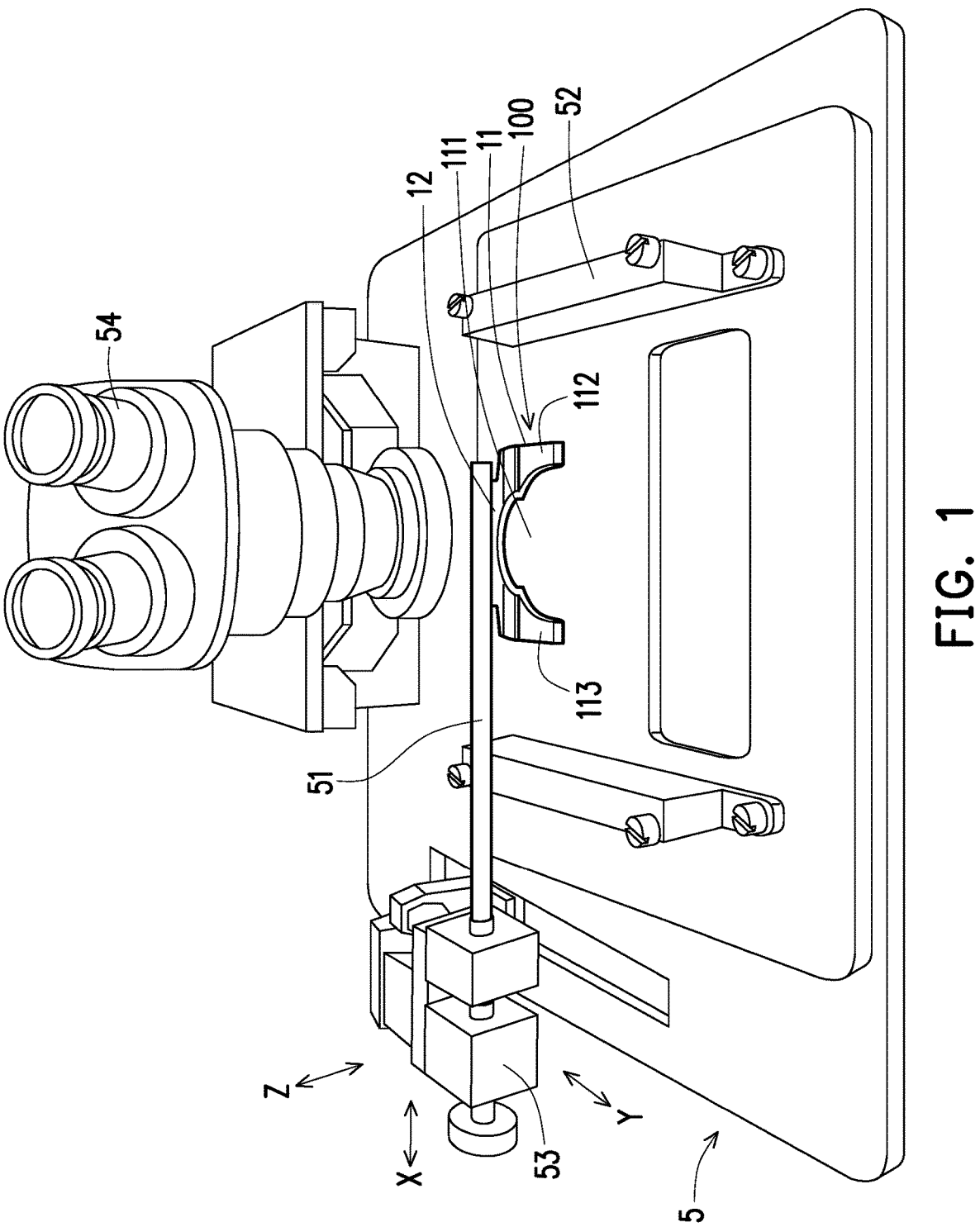
FIG. 1 is a perspective diagram of a use state of a jig according to an embodiment of the disclosure.

Referring to FIG. 1 to FIG. 7, diagrams of embodiments of the disclosure are disclosed. The above diagrams illustrate a jig for grinding probe pins of a probe card according to the disclosure. A jig 100 includes a structure of a carrier 11 and a connecting part 12 (shown in FIG. 2). The carrier 11 of the jig 100 can be configured to carry a support body 31 attached with a grinding sheet 2 (shown in FIG. 3). The carrier 11 has an opening 111 (shown in FIG. 2). The support body 31 straddles above the opening 111. The size of the opening 111 can at least expose a plurality of probe pins 61 of a probe card 6 (shown in FIG. 6 and FIG. 7). The connecting part 12 is connected to the carrier 11 (shown in FIG. 2). The carrier 11 can be detachably disposed on an adjustment crossbar 51 of a pin adjusting machine 5 through the connecting part 12 (shown in FIG. 4).

Referring to FIG. 4 to FIG. 8, the pin adjusting machine 5 is disposed with a fixed base 52 for the probe card 6 and a multi-axial adjustment displacer 53. The fixed base 52 can place and position a probe card 6, so that the plurality of probe pins 61 of the probe card 6 face upward. One end of the adjustment crossbar 51 is disposed on the multi-axial adjustment displacer 53, so that the other end of the adjustment crossbar 51 extends above the probe card 6. The jig 100 is disposed at the other end of the adjustment crossbar 51. The multi-axial adjustment displacer 53 has a plurality of knobs that can be operated and adjusted by the personnel. Through the adjustment knobs, the multi-axial adjustment displacer 53 can be controlled to drive the adjustment crossbar 51 so as to drive the jig 100 to move along the X-axis, Y-axis, and Z-axis onto the probe card 6.

Figure 2:
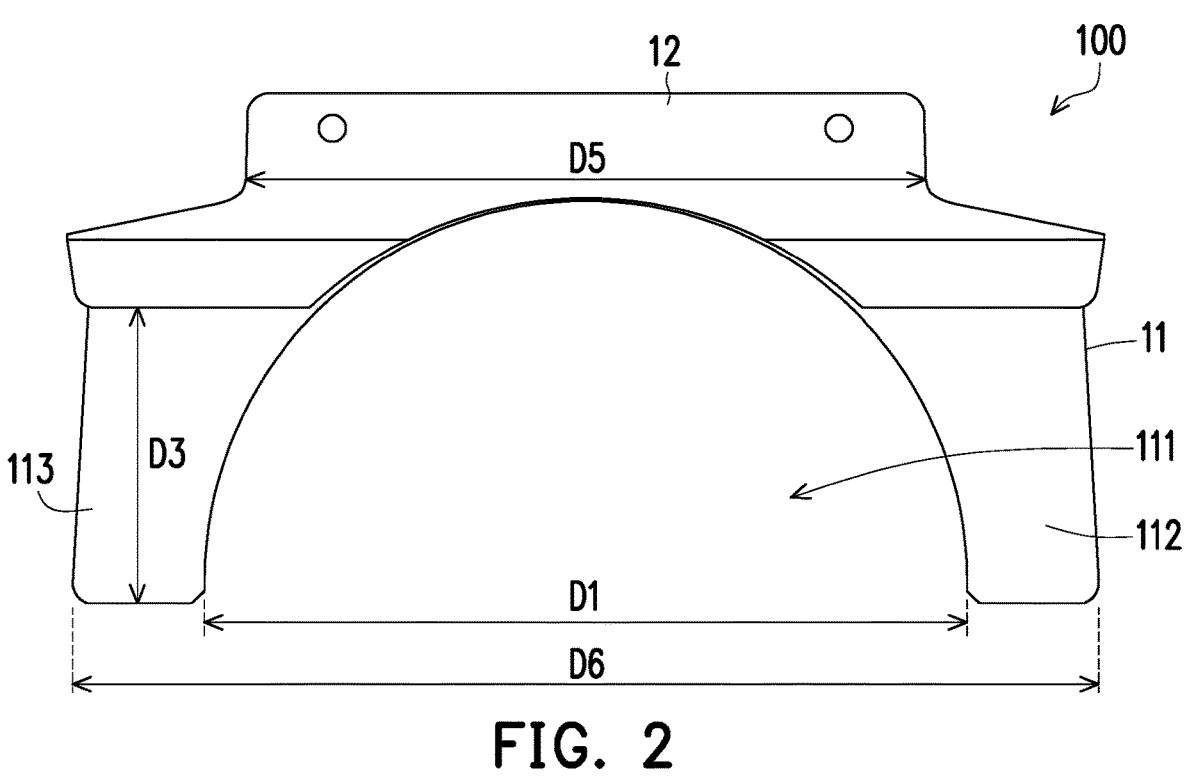
FIG. 2 is a top view diagram of a jig according to an embodiment of the disclosure.
Figure 3:
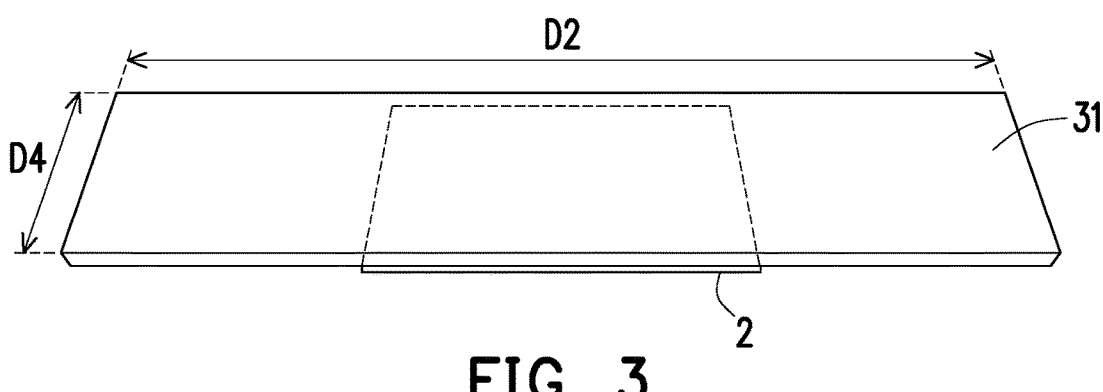
FIG. 3 is a perspective diagram of a support body according to an embodiment of the disclosure.
Figure 4:
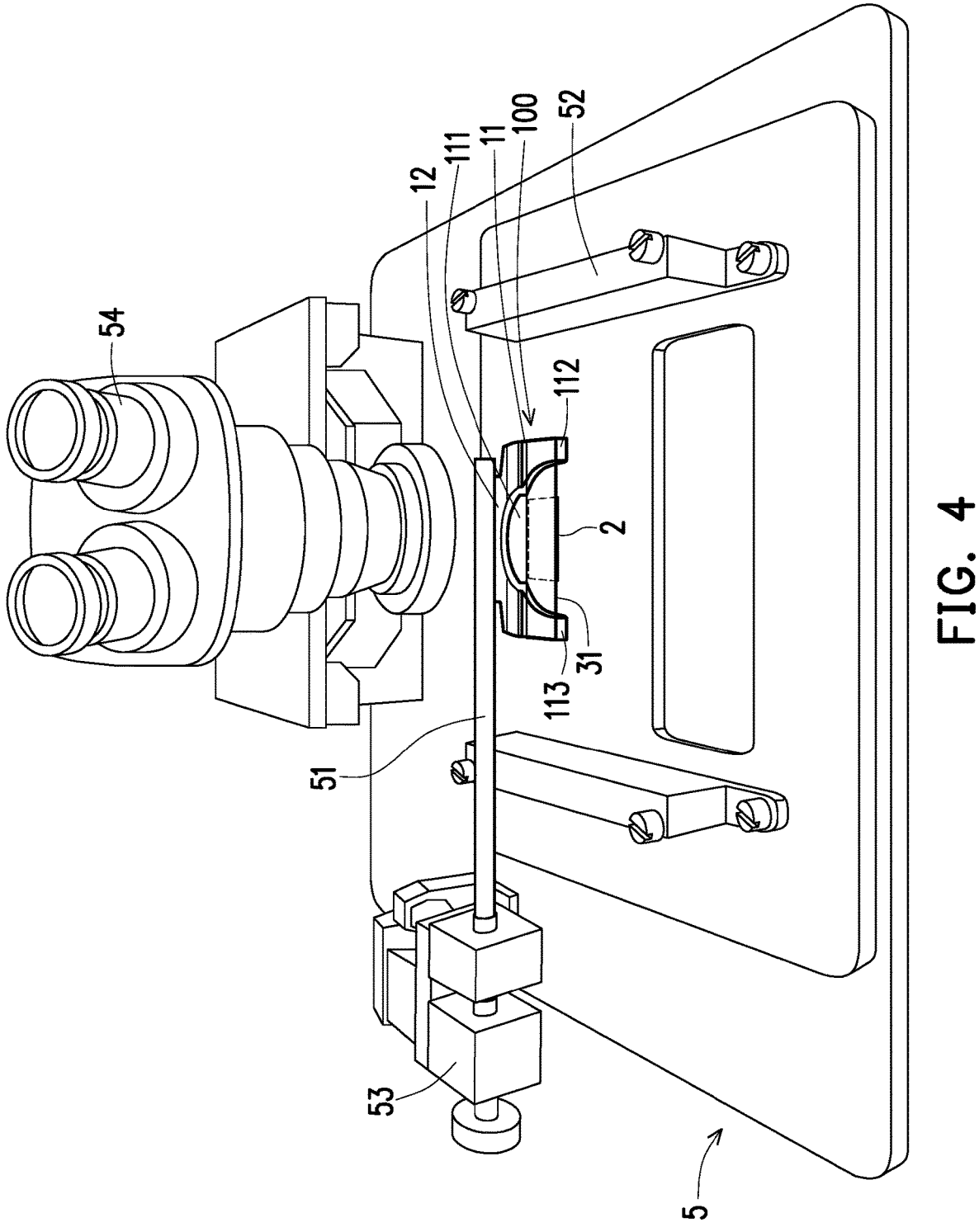
FIG. 4 is a perspective diagram of the use state of FIG. 1.
Figure 5:
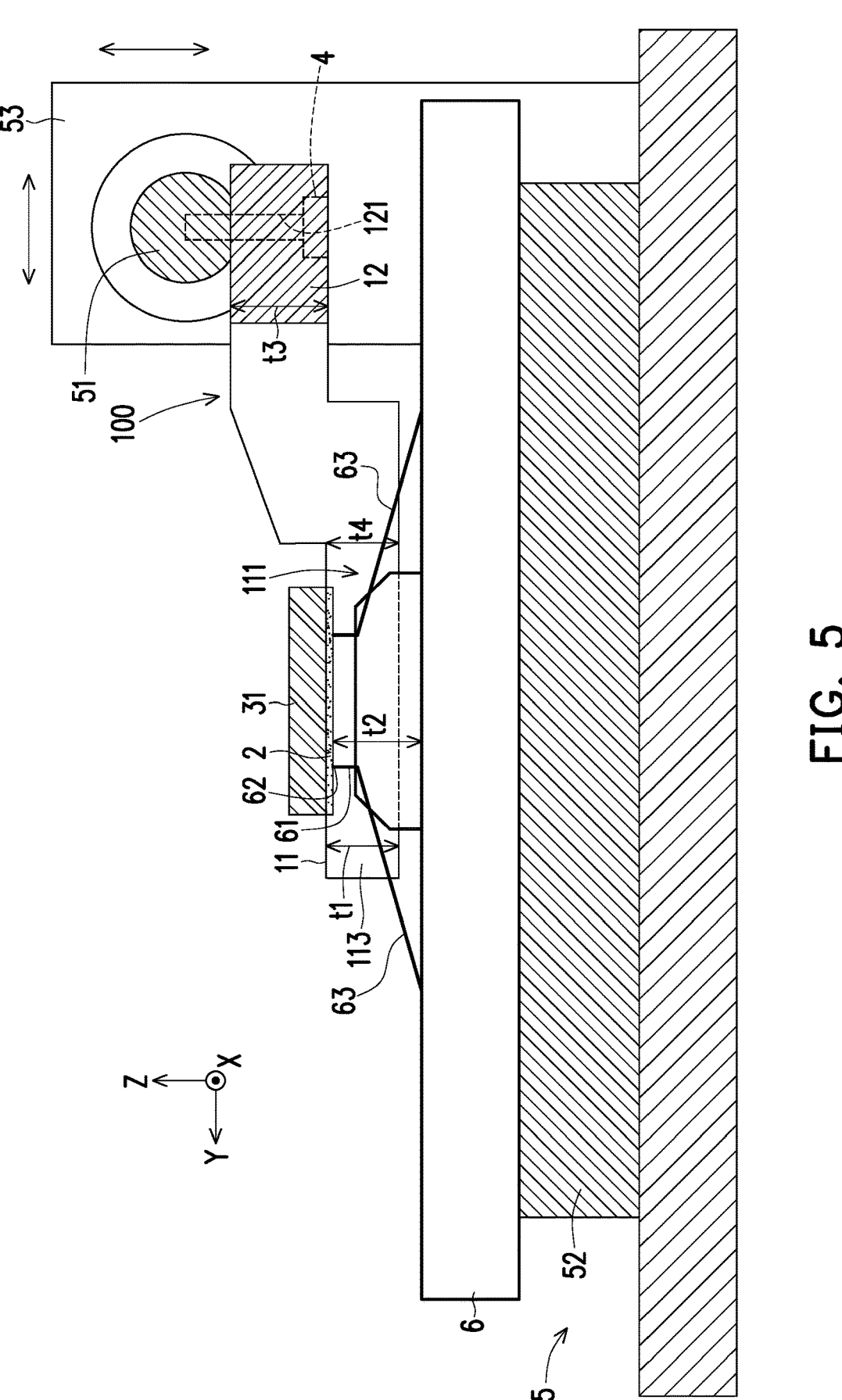
FIG. 5 is a schematic cross-sectional diagram of the use state of FIG. 4.
Figure 6:
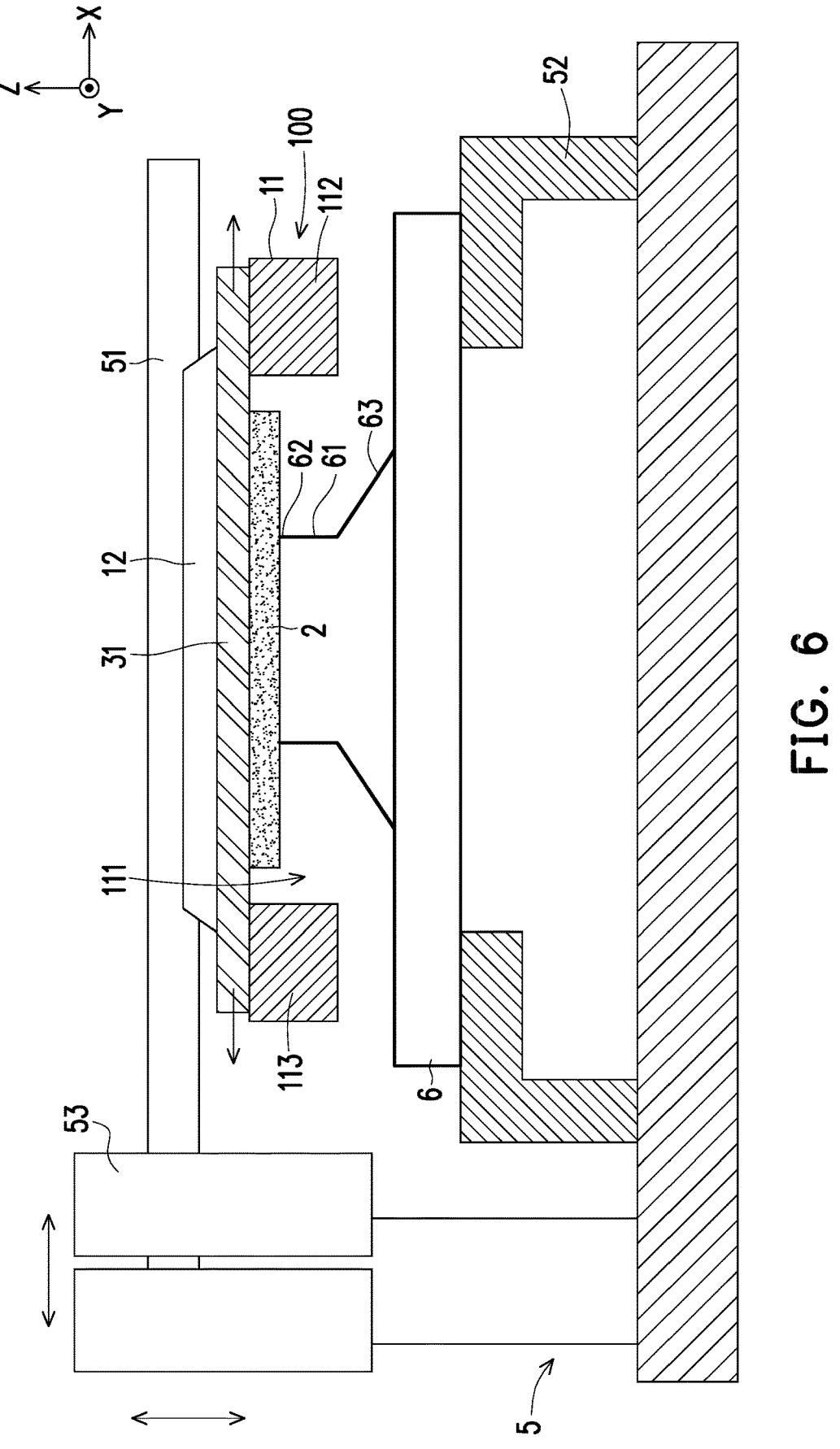
FIG. 6 is a schematic cross-sectional diagram of the use state of FIG. 4 from another perspective.
Figure 7:
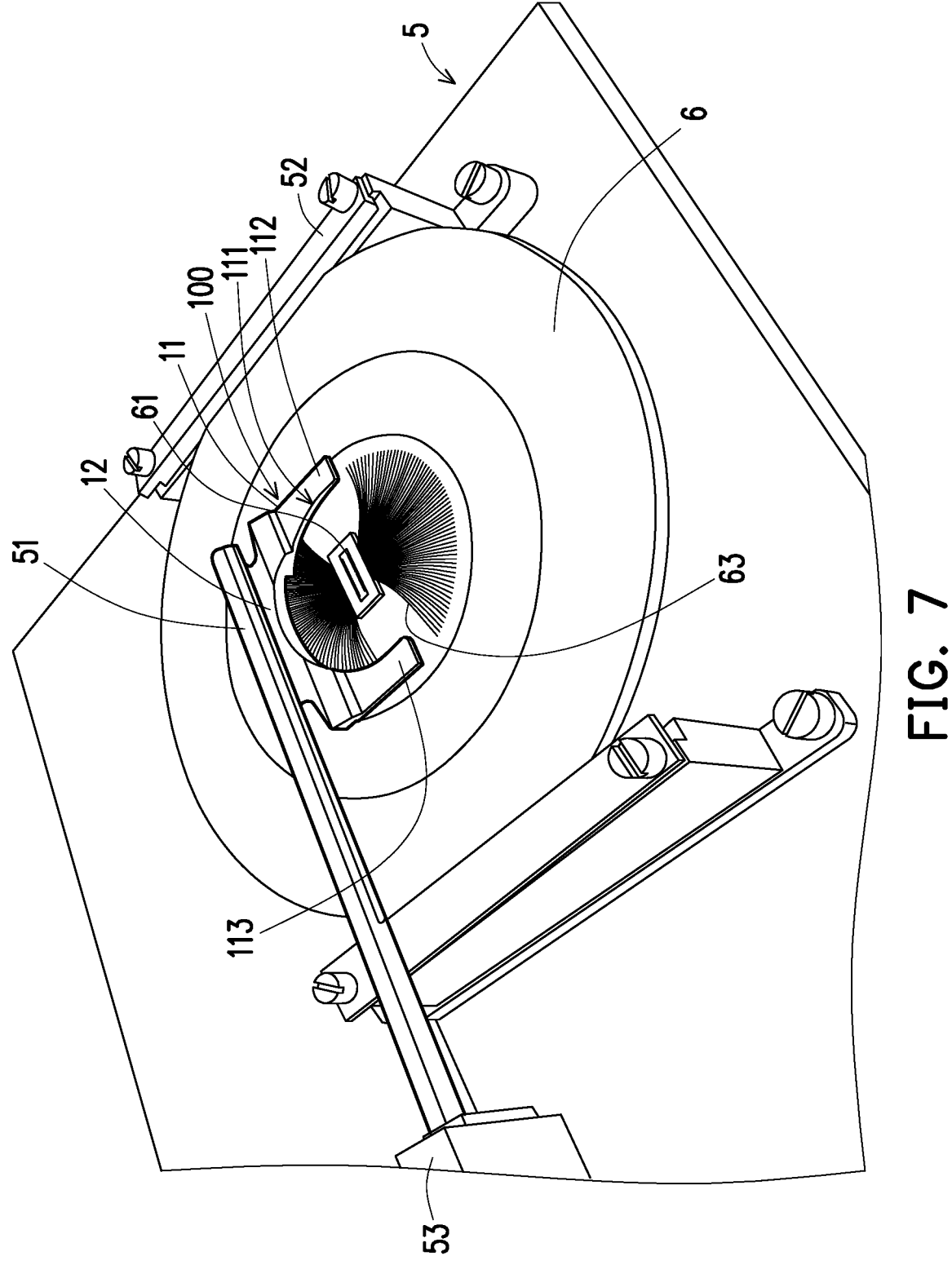
FIG. 7 is a partial perspective diagram of another use state of FIG. 1.
Figure 8:
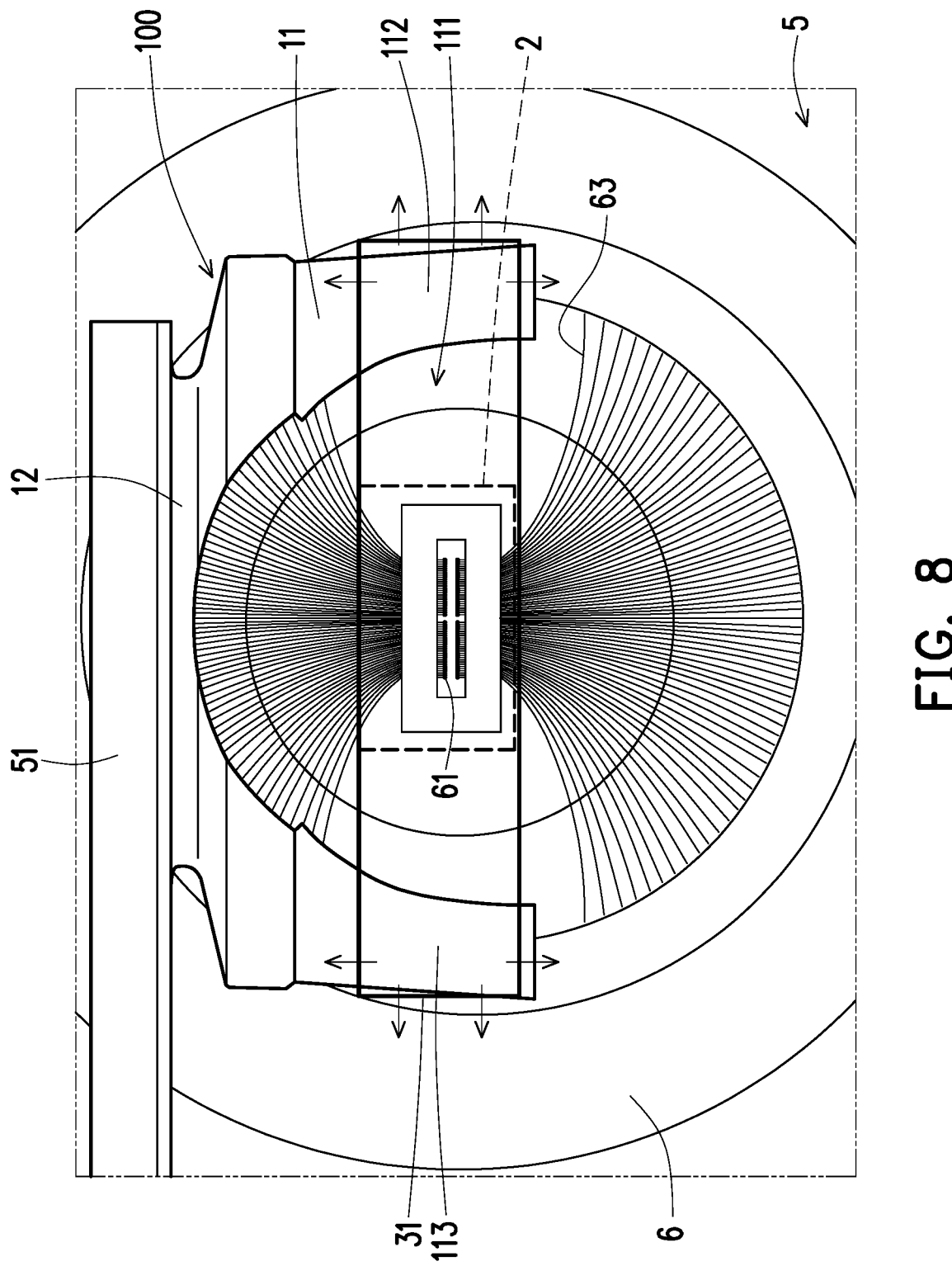
FIG. 8 is a partial top view diagram of the use state of FIG. 7.

Referring to FIG. 5, the carrier 11 of the jig 100 has substantially a same thickness t1. The thickness t1 of the carrier 11 is less than a height t2 from the top surface of the probe card 6 to pin tips 62 of the probe pins 61. Referring to FIG. 2 and FIG. 3, a width D3 of the carrier 11 is greater than a width D4 of the support body 31.

Figure 10:
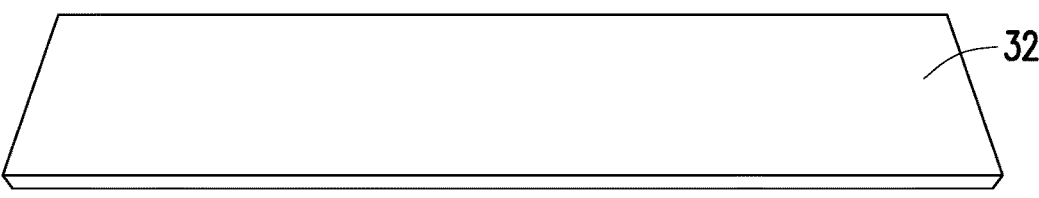
FIG. 10 is a perspective diagram of a transparent sheet according to an embodiment of the disclosure.

Referring to FIG. 1, FIG. 2, FIG. 3, and FIG. 6, the carrier 11 of the jig 100 includes two support arms 112 and 113. The support arms 112 and 113 may be symmetrical to each other. The two support arms 112 and 113 are on the same horizontal plane, and their top surfaces are parallel to the top surface of the probe card 6 (shown in FIG. 3 and FIG. 4). Referring to FIG. 2, the two support arms 112 and 113 can carry the support body 31 (shown in FIG. 3 and FIG. 4), so that the two ends of the support body 31 can be placed on the top surfaces of the two support arms 112 and 113 respectively. The two support arms 112 and 113 of the carrier 11 can also carry a transparent sheet 32 (shown in FIG. 10). The transparent sheet 32 is, for example, a glass sheet or a transparent plastic sheet. The transparent sheet 32 straddles the support arms 112 and 113, so that the personnel can see the plurality of probe pins 61 of the probe card 6 through the transparent sheet 32 above the opening 111.

Referring to FIG. 2, the opening 111 of the carrier 11 is disposed between the two support arms 112 and 113. The opening 111 may be, for example, semicircular, rectangular (not shown), or square (not shown). A diameter D1 of the opening 111 is less than a length D2 of the support body 31. Furthermore, referring to FIG. 7 and FIG. 8, the opening 111 exposes a plurality of electrical traces 63 of the probe card 6, so that the carrier 11 can avoid the plurality of electrical traces 63 when contacting the probe card 6 to avoid crushing the plurality of electrical traces 63.

Figure 9:
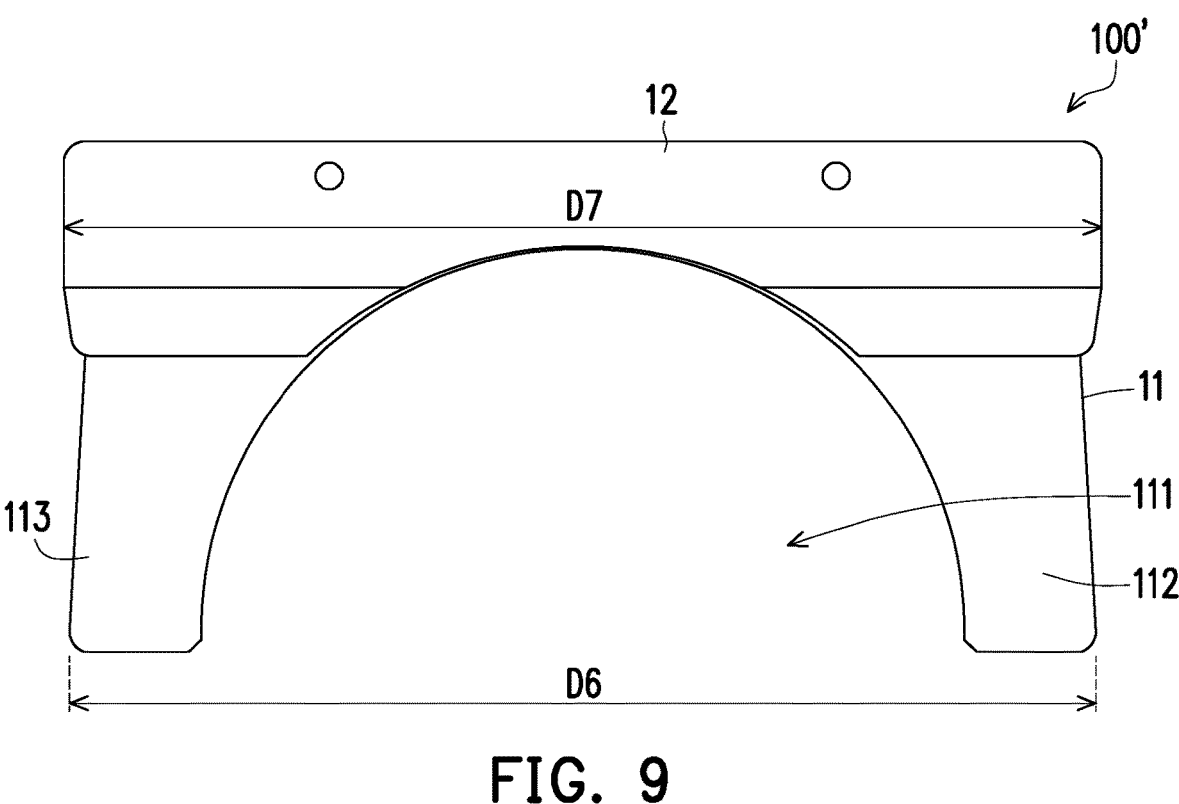
FIG. 9 is a top view diagram of a jig of another embodiment of FIG. 2.

Referring to FIG. 2, the connecting part 12 of the jig 100 is connected to the two support arms 112 and 113 of the carrier 11. A middle length D5 of the connecting part 12 may be less than a length D6 of the carrier 11. Alternatively, referring to FIG. 9, a middle length D7 of the connecting part 12 of the jig 100' may be equal to the length D6 of the carrier 11.

Referring to FIG. 5, a thickness t3 of the connecting part 12 close to the adjustment crossbar 51 is greater than a thickness t4 of the connecting part 12 close to the carrier 11. In some embodiments, the thickness of the connecting part 12 increases in a gradient from the side close to the carrier 11 to the side close to the adjustment crossbar 51, but is not limited thereto. Accordingly, the structural strength of the connecting part 12 is improved.

The connecting part 12 and the adjustment crossbar 51 are positioned through a plurality of screws 4 interlocking one another. In some embodiments, the connecting part 12 is disposed with a plurality of lock holes 121. The adjustment crossbar 51 can be locked on the plurality of lock holes 121 of the connecting part 12 through the plurality of screws 4.

Referring to FIG. 3, the grinding sheet 2 configured to grind the plurality of probe pins 61 of the probe card 6 is attached to the bottom surface of the support body 31. The support body 31 may be, for example, a transparent support body made of transparent material. The supporting body 31 is, for example, a transparent sheet composed of transparent glass or plastic. The grinding sheet 2 attached to the bottom surface of the support body 31 can be in contact with the plurality of probe pins 61 of the probe card 6 by a height adjustment of the adjustment crossbar 51.

Based on the above component composition, a method for grinding the probe pins of the probe card can be implemented according to the embodiment of the disclosure. Referring to FIG. 11, a flowchart of a method according to an embodiment of the disclosure is disclosed, which includes the following method steps:

Step S10: Provide the jig 100 (refer to FIG. 2 for details).

Step S11: Dispose the connecting part 12 of the jig 100 on the adjustment crossbar 51 of the pin adjusting machine 5 (refer to FIG. 1 for details).

Figure 13:
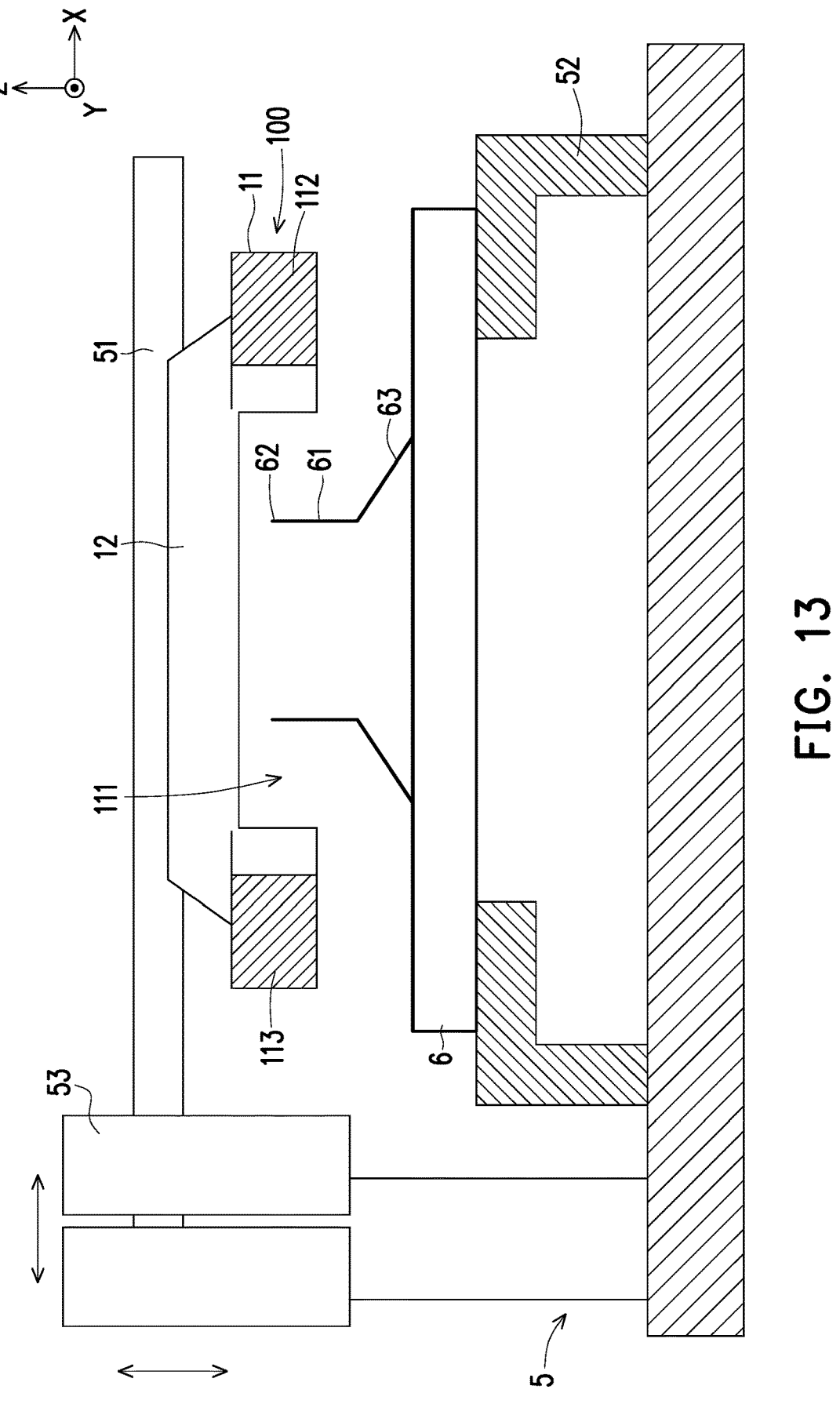
FIG. 13 is a schematic cross-sectional diagram of another use state of FIG. 6.

Step S12: Place the probe card 6 on the fixed base 52 of the pin adjusting machine 5 (refer to FIG. 13 for details), in which the pin tips 62 of the plurality of probe pins 61 of the probe card 6 face upward.

Step S13: Adjust the adjustment crossbar 51 and move the jig 100 above the probe card 6 (refer to FIG. 13 for details). The multi-axial adjustment displacer 53 of the pin adjusting machine 5 allows the personnel to manually operate and fine-tune, so that the multi-axial adjustment displacer 53 can be driven to drive the adjustment crossbar 51 and move the jig 100 above the probe card 6, and the multi-axial adjustment displacer 53 can adjust the height of the jig 100.

Step S14: Attach the grinding sheet 2 to the bottom surface of the support body 31 (refer to FIG. 3 for details).

Step S15: Move the adjustment crossbar 51 and the jig 100, so that the opening 111 of the jig 100 is aligned from top to bottom to expose the plurality of probe pins 61. Referring to FIG. 12, in the embodiment, step S15 further includes step S151, step S152, and step S153.

Figure 14:
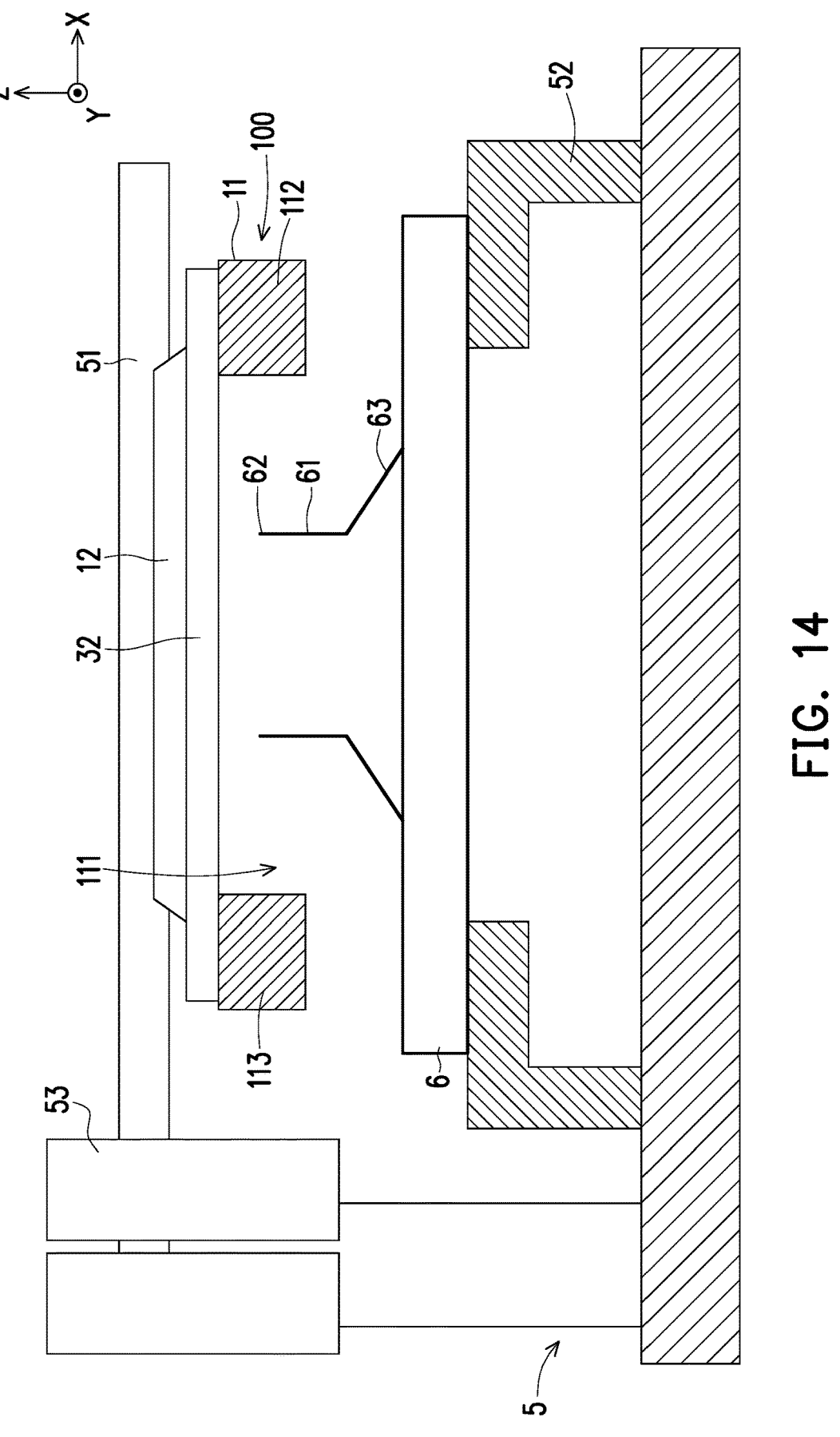
FIG. 14 is a schematic cross-sectional diagram of a next use state of FIG. 6.

Step S151: Place the transparent sheet 32 on the top surfaces of the two support arms 112 and 113 of the carrier 11 of the jig 100 (refer to FIG. 14 for details), so that the transparent sheet 32 straddles above the opening 111 and faces downward towards the pin tips 62 of the plurality of probe pins 61. The transparent sheet 32 is a transparent sheet composed of glass or plastic.

Figure 15:
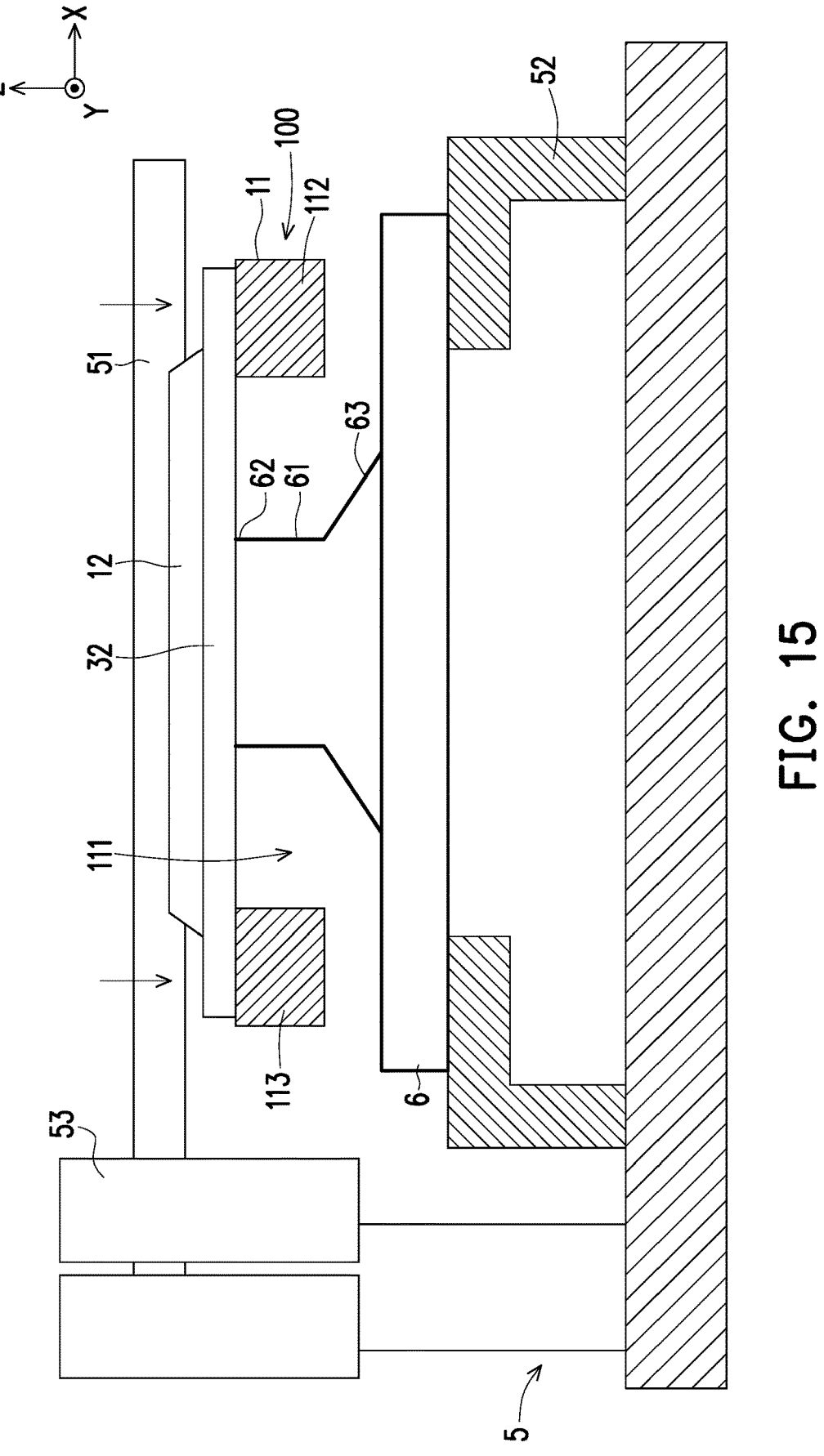
FIG. 15 is a schematic cross-sectional diagram of yet another use state of FIG. 6.

Step S152: Adjust the height of the jig 100 (refer to FIG. 15 for details), so that the support arms 112 and 113 of the carrier 11 carry the transparent sheet 32 and descend in a horizontal state such that the bottom surface of the transparent sheet 32 is in contact with the plurality of pin tips 62 of the plurality of probe pins 61. During this period, the personnel can determine in real time the levelness of the plurality of pin tips 62 and the transparent sheet 32 through the transparent sheet 32.

Figure 16:
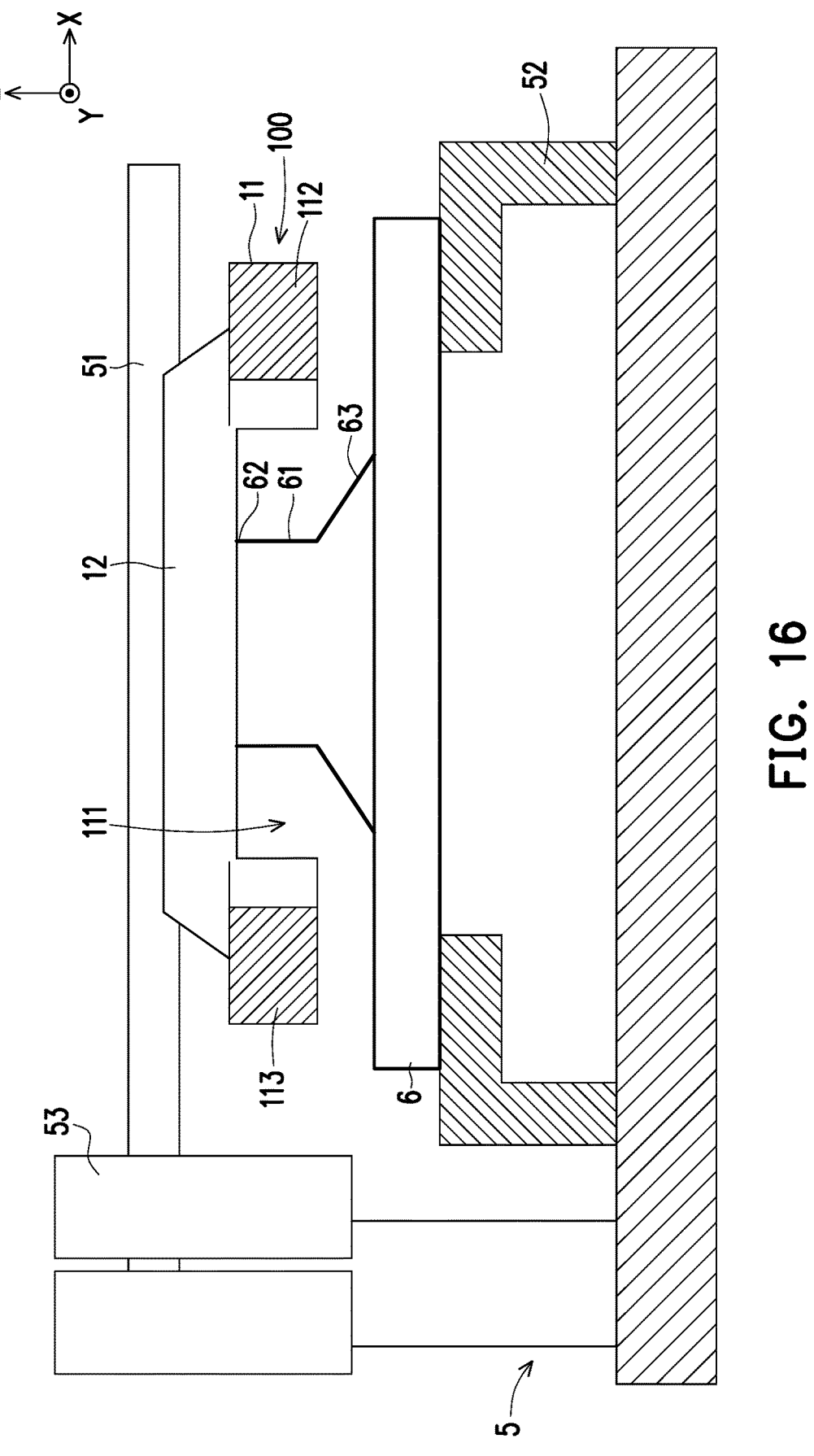
FIG. 16 is a schematic cross-sectional diagram of still another use state of FIG. 6.

Step S153: Remove the transparent sheet 32 on the top surfaces of the support arms 112 and 113 of the carrier 11 of the jig 100 (refer to FIG. 16 for details).

Step S16: Place the support body 31 attached with the grinding sheet 2 on the top surfaces of the two support arms 112 and 113 of the carrier 11 of the jig 100 (refer to FIG. 6 for details), so that the support body 31 and the grinding sheet 2 straddle above the opening 111, in which the grinding sheet 2 faces downward and contacts the pin tips 62 of the plurality of probe pins 61.

Step S17: Determine through a microscope 54 of the pin adjusting machine 5 that the plurality of probe pins 61 are within the contact range of the grinding sheet 2 (refer to FIG. 8 for details).

Step S18: Hold the two sides of the support body 31 by hand, and move the support body 31 back and forth along the top surfaces of the support arms 112 and 113 of the carrier 11 (refer to FIG. 6 and FIG. 8 for details), so that the support body 31 moves, rotates, or circles horizontally in a straight line along the top surfaces of the support arms 112 and 113 of the carrier 11 for the grinding sheet 2 to grind the plurality of pin tips 62 of the plurality of probe pins 61. During the period when the support body 31 is pushed against by the personnel with bare hands to move back and forth along the top surfaces of the support arms 112 and 113 of the carrier 11, the grinding status of the pin tips 62 can be determined in real time through the microscope 54. The ground pin tips 62 and the unground pin tips 62 can be clearly distinguished through the microscope.

In addition, in another embodiment, since the support body 31 is a transparent sheet composed of transparent glass or plastic, in step S15, the transparent support body 31 attached with the grinding sheet 2 can also be directly placed on the top surfaces of the two support arms 112 and 113 of the carrier 11 of the jig 100, and then the height of the jig 100 can be adjusted to lower the carrier 11 and the transparent support body 31, so that the grinding sheet 2 is in contact with the plurality of pin tips 62 of the plurality of probe pins 61.

The method of grinding the probe pins of the probe card according to an embodiment of the disclosure is to point the plurality of probe pins 61 of the probe card 6 upward. By utilizing the height fine-adjustment function of the existing pin adjusting machine 5 and using the transparent support body 31 and the transparent sheet 32, it allows the personnel to easily directly observe the height and adjust the distance when adjusting the support body 31 and the transparent sheet 32. In addition, the support body 31, the transparent sheet 32, and the grinding sheet 2 can be moved by the carrier 11 of the jig 100 to maintain a horizontal decline and rise, so that the grinding sheet 2 is in a horizontal state and contacts the pin tips 62 of the plurality of probe pins 61 from top to bottom, and it may allow for real-time observation and determination of the contact status between the grinding sheet 2 and the pin tips 62 of the probe pins 61. When the grinding sheet 2 is in contact with the pin tips 62 of the probe pins 61, the top surfaces of the support arms 112 and 113 of the carrier 11 can be configured to support the support body 31 and the grinding sheet 2 to move or circle horizontally along the left and right directions, so that the grinding sheet 2 is moved in a horizontal state to grind the pin tips 62 of the plurality of probe pins 61.

In summary, the disclosure can simply, accurately, and quickly operate the grinding sheet to lower in a horizontal state until it contacts the pins of the plurality of probe pins to precisely grind the plurality of pin tips, thereby improving the convenience and grinding efficiency of trimming the probe pins of the probe card and saving time in adjusting the pin tips of the probe pins for horizontal abnormalities. In addition, the existing pin adjusting machine can be used in conjunction with the fixed jig for pin grinding purposes, thereby improving the function of the existing pin adjusting machine and saving the cost of purchasing a dedicated pin grinding machine.

What is claimed is:

1. A jig for grinding probe pins of a probe card, comprising:
   a carrier, configured to carry a support body with a grinding sheet, wherein the carrier has an opening, the support body and the grinding sheet can straddle above the opening, a size of the opening can at least expose a plurality of probe pins of the probe card, and a diameter of the opening is less than a length of the support body; and
   a connecting part, connected to the carrier, wherein the carrier is detachably disposed on an adjustment crossbar of a pin adjusting machine through the connecting part.

2. The jig for grinding the probe pins of the probe card according to claim 1, wherein the carrier comprises two support arms that are symmetrical to each other, the opening is disposed between the two support arms so that the opening is semicircular, top surfaces of the two support arms and a top surface of the probe card are parallel to each other, and two ends of the support body are respectively placed on the top surfaces of the two support arms.

3. The jig for grinding the probe pins of the probe card according to claim 1, wherein the carrier has a same thickness, the thickness of the carrier is less than a height from the top surface of the probe card to a plurality of pin tips of the plurality of probe pins, and a width of the carrier is greater than a width of the support body.

4. The jig for grinding the probe pins of the probe card according to claim 1, wherein the opening exposes a plurality of electrical traces of the probe card.

5. The jig for grinding the probe pins of the probe card according to claim 1, wherein a thickness of the connecting part close to the adjustment crossbar is greater than a thickness of the connecting part close to the carrier.

6. The jig for grinding the probe pins of the probe card according to claim 1, wherein a thickness of the connecting part increases in a gradient from a side close to the carrier to a side close to the adjustment crossbar.

7. The jig for grinding the probe pins of the probe card according to claim 1, wherein the carrier can carry a transparent sheet, and the transparent sheet can straddle above the opening.

8. The jig for grinding the probe pins of the probe card according to claim 1, wherein a middle length of the connecting part is less than or equal to a length of the carrier.

9. The jig for grinding the probe pins of the probe card according to claim 1, wherein the connecting part and the adjustment crossbar are positioned through a plurality of screws interlocking one another.

10. The jig for grinding the probe pins of the probe card according to claim 1, wherein the support body is a transparent support body made of a transparent material, and the grinding sheet is attached to a bottom surface of the support body.

11. The jig for grinding the probe pins of the probe card according to claim 10, wherein the support body is a transparent sheet made of transparent glass or plastic.

12. The jig for grinding the probe pins of the probe card according to claim 1, wherein a fixed base for placing the probe card and a multi-axial adjustment displacer are disposed on the pin adjusting machine, one end of the adjustment crossbar is disposed on the multi-axial adjustment displacer, the other end of the adjustment crossbar extends above the probe card, the carrier is disposed on the other end of the adjustment crossbar, and the multi-axial adjustment displacer can drive the carrier to move along a plurality of axial directions onto the probe card through the adjustment crossbar.

13. A method for grinding probe pins of a probe card, comprising:

providing a jig, wherein the jig comprises a carrier and a connecting part, and the carrier has an opening;

disposing the connecting part of the jig on an adjustment crossbar of a pin adjusting machine;

placing the probe card on a fixed base of the pin adjusting machine, wherein a plurality of pin tips of a plurality of probe pins of the probe card face upward;

attaching a grinding sheet to a bottom surface of a support body;

moving the adjustment crossbar and the jig, so that the opening of the jig is aligned from top to bottom to expose the plurality of probe pins;

placing the support body attached with the grinding sheet on a top surface of the carrier of the jig, so that the support body and the grinding sheet straddle above the opening, wherein the grinding sheet faces downward and contacts the plurality of pin tips of the plurality of probe pins; and moving the support body back and forth along the top surface of the carrier, so that the grinding sheet grinds the plurality of pin tips of the plurality of probe pins.

14. The method for grinding the probe pins of the probe card according to claim 13, wherein moving the adjustment crossbar and the jig comprises:

placing a transparent sheet on the top surface of the carrier of the jig, so that the transparent sheet straddles above the opening and faces downward toward the plurality of pin tips of the plurality of probe pins;

adjusting a height of the jig, so that the transparent sheet is in contact with the plurality of pin tips of the plurality of probe pins; and removing the transparent sheet on the top surface of the carrier of the jig.

15. The method for grinding the probe pins of the probe card according to claim 13, comprising: after the probe card is placed on the fixed base of the pin adjusting machine, adjusting the adjustment crossbar and moving the jig above the probe card.

16. The method for grinding the probe pins of the probe card according to claim 13, wherein the support body moves or rotates horizontally in a straight line along the top surface of the carrier.

17. The method for grinding the probe pins of the probe card according to claim 13, wherein the support body comprises a transparent material.

18. The method for grinding the probe pins of the probe card according to claim 13, wherein a material of the support body comprises glass or plastic.

* * * * *